(12) United States Patent
Nakayama et al.

(10) Patent No.: US 11,467,310 B2
(45) Date of Patent: Oct. 11, 2022

(54) PROXIMITY SENSOR, AND ASSEMBLY METHOD OF PROXIMITY SENSOR

(71) Applicant: OMRON Corporation, Kyoto (JP)

(72) Inventors: Yusuke Nakayama, Kameoka (JP); Daisuke Inoue, Ayabe (JP); Yuki Ushiro, Ayabe (JP); Takaaki Sanda, Fukuchiyama (JP); Hiroto Katsura, Fukuchiyama (JP)

(73) Assignee: OMRON Corporation, Kyoto (JP)

( * ) Notice: Subject to any disclaimer, the term of this patent is extended or adjusted under 35 U.S.C. 154(b) by 0 days.

(21) Appl. No.: 17/287,115

(22) PCT Filed: Oct. 30, 2019

(86) PCT No.: PCT/JP2019/042563
§ 371 (c)(1),
(2) Date: Apr. 21, 2021

(87) PCT Pub. No.: WO2020/100592
PCT Pub. Date: May 22, 2020

(65) Prior Publication Data
US 2021/0356618 A1    Nov. 18, 2021

(30) Foreign Application Priority Data
Oct. 30, 2019   (JP) .............................. JP2018-212365

(51) Int. Cl.
*G01V 3/10*        (2006.01)
*H05K 5/03*        (2006.01)
(52) U.S. Cl.
CPC .................. *G01V 3/10* (2013.01); *H05K 5/03* (2013.01)
(58) Field of Classification Search
None
See application file for complete search history.

(56) References Cited

U.S. PATENT DOCUMENTS

| 2011/0187353 A1* | 8/2011 | Mizusaki | ........... H03K 17/9505 |
| | | | 324/207.11 |
| 2012/0223231 A1* | 9/2012 | Nijaguna | .............. G01J 1/0214 |
| | | | 250/216 |

FOREIGN PATENT DOCUMENTS

| JP | S5646154 | 4/1981 |
| JP | H0945193 | 2/1997 |

(Continued)

OTHER PUBLICATIONS

"International Search Report (Form PCT/ISA/210) of PCT/JP2019/042563", dated Dec. 24, 2019, with English translation thereof, pp. 1-4.

(Continued)

*Primary Examiner* — Patrick Assouad
*Assistant Examiner* — Haidong Zhang
(74) *Attorney, Agent, or Firm* — JCIPRNET

(57) ABSTRACT

This proximity sensor includes: a cylindrical housing having an opening at one end in the axial direction; a detection part housed at the other end of the housing and detecting the presence or absence of a detection target contactlessly; a substrate housed in the housing and mounted with a control circuit for controlling the detection part; a detection part shield preventing external noise from entering the detection part and including a first face part adhered to the front surface on the other side of the detection part, and a side face part configured from multiple side pieces connected to the outer periphery of the first face part and bent from the first face part to cover the side surface of the detection part; and a resin provided around the detection part and the detection part shield.

8 Claims, 14 Drawing Sheets

(56) References Cited

FOREIGN PATENT DOCUMENTS

| | | | |
|---|---|---|---|
| JP | H0955153 | | 2/1997 |
| JP | 2009048902 | | 3/2009 |
| JP | 2009048902 A | * | 3/2009 |
| JP | 2009064711 A | * | 3/2009 |
| JP | 2010139351 | | 6/2010 |
| JP | 2018125184 | | 8/2018 |

OTHER PUBLICATIONS

"Written Opinion of the International Searching Authority (Form PCT/ISA/237) of PCT/JP2019/042563", dated Dec. 24, 2019, with English translation thereof, pp. 1-8.

"Search Report of Europe Counterpart Application", dated Jun. 27, 2022, p. 1-p. 8.

* cited by examiner

PROXIMITY SENSOR, AND ASSEMBLY METHOD OF PROXIMITY SENSOR

CROSS-REFERENCE TO RELATED APPLICATION

This application is a 371 application of the International PCT application serial no. PCT/JP2019/042563, filed on Oct. 30, 2019, which claims the priority benefits of Japan Patent Application No. 2018-212365, filed on Nov. 12, 2018. The entirety of each of the above-mentioned patent applications is hereby incorporated by reference herein and made a part of this specification.

TECHNICAL FIELD

The present invention relates to a proximity sensor and an assembly method of the proximity sensor.

DESCRIPTION OF RELATED ART

In proximity sensors, there is a proximity sensor which is provided with a cylindrical housing, a unit (hereinafter, also referred to as a "detection part") including a core and a detection coil, and a substrate on which a control circuit for controlling the detection part is mounted, and which detects the presence or absence or a position of a metal body in a non-contact manner. In such a proximity sensor, the detection part may be covered with a shield member in order to prevent noise from entering the coil from the outside. For example, Patent Literature 1 below discloses a proximity sensor including a cylindrical shield part wound along a circumferential surface of a core to surround a detection part (a coil assembly). Further, as shown in FIG. 8 of Patent Literature 1 below, the cylindrical shield part is formed in a single-pieced rectangular shape and is connected to a circular plate-shaped shield part adhesively fixed to a front surface of the detection part at one place via a connection part.

RELATED ART

Patent Literature

[Patent Literature 1]
Japanese Patent Laid-Open No. 2009-48902

SUMMARY

Technical Problem

In the proximity sensors as described above, there are ones in which, when assembling, a resin is poured into a housing to seal components such as a detection part and a substrate into the housing. In such a proximity sensor, first, a resin is poured into a housing, and components such as a detection part and a shield member that covers the detection part are pushed into the resin. Then, in a state in which these detection parts and the like are pushed into the resin, the components are sealed in by curing the resin.

However, in the proximity sensor of Patent Literature 1, since the cylindrical shield part is wound around the circumferential surface of the core in the state in which it is connected to the plate-shaped shield part at one place, there is a problem that positional displacement of an unconnected part of the cylindrical shield part occurs due to a reaction force of the resin when it is pushed into the resin in the housing. When this positional displacement occurs in this way, a part of the circumferential surface of the core of the detection part covered by the cylindrical shield part is exposed, and it is difficult to prevent noise from entering the detection part from the outside.

Therefore, the present invention provides a proximity sensor in which positional displacement of a shield member that covers a periphery of a detection part is inhibited.

Solution to Problem

A proximity sensor according to one aspect of the present invention includes: a cylindrical housing including an opening part at one end in an axial direction thereof; a detection part which is housed at the other end side of the housing and detects the presence or absence of a detection target in a non-contact manner; a substrate which is housed in the housing and on which a control circuit for controlling the detection part is mounted; a detection part shield configured to prevent noise from entering the detection part from the outside, which includes a first face part that adheres to a front surface located on the other end side of the detection part, and a side face part that is configured of a plurality of side pieces connected to an outer periphery of the first face part and is bent from the first face part to cover a side surface of the detection part; and a resin which is provided around the detection part and the detection part shield.

According to this aspect, in the proximity sensor, since the side face part of the detection part shield that covers the side surface of the detection part is configured of the plurality of side pieces that is connected to the outer periphery of the first face part that adheres to the front surface of the detection part, positional displacement due to a reaction force of the resin present around the detection part is inhibited.

In the above aspect, the detection part shield may include a second face part which adheres to a back surface of the detection part facing the front surface, is disposed to be located between the detection part and the substrate, and performs relaying for electrical connection between the detection part and the substrate.

According to this aspect, the detection part shield can electrically connect a coil of the detection part to the control circuit of the substrate.

In the above aspect, two of the plurality of side pieces may be provided and connected to the outer periphery of the first face part to face each other.

According to this aspect, the plurality of side pieces can constitute the side face part in a well-balanced manner with the minimum number of components.

In the above aspect, three or more of the plurality of side pieces may be provided and connected to the outer periphery of the first face part at substantially equal intervals.

According to this aspect, the plurality of side pieces can constitute the side face part in a well-balanced manner.

In the above aspect, the plurality of side pieces may be provided as four pieces to be connected to the outer periphery of the first face part at substantially equal intervals, and one set of side pieces facing each other may be folded along folds extending in the axial direction and located further inward than the other set of side pieces facing each other.

According to this aspect, when the detection part and the detection part shield are inserted into the housing, the side face part can be naturally folded such that the one set of side pieces having the folds is disposed on the inner side than the other set of side pieces to cover a periphery of the side face part of the detection part.

In the above aspect, at least some of outer edges of the plurality of side pieces on a first face part side may be inclined such that a distance thereof from the first face part increases.

According to such an aspect, when the detection part and the detection part shield are inserted into the housing, the plurality of side pieces can be easily wound along the outer periphery of the side surface of the detection part.

In the above aspect, the plurality of side pieces may have a region in which two adjacent side pieces are folded to overlap each other when they are bent from the first face part and the two adjacent side pieces may adhere to each other in the overlapping region.

According to this aspect, the side pieces of the detection part shield can adhere to each other more closely.

An assembly method of a proximity sensor according to one aspect of the present invention is an assembly method of a proximity sensor that includes: a cylindrical housing including an opening part at one end in an axial direction thereof; a detection part which is housed at the other end side of the housing and detects the presence or absence of a detection target in a non-contact manner; a substrate which is housed in the housing and on which a control circuit for controlling the detection part is mounted; and a detection part shield configured to prevent noise from entering the detection part from the outside, which includes a first face part, a side face part that is configured of a plurality of side pieces connected to an outer periphery of the first face part, and a second face part connected to the side face part, in which the assembly method of the proximity sensor includes the steps of: adhering the first face part of the detection part shield to a front surface located on the other end side of the detection part and adhering the second face part of the detection part shield to a back surface facing the front surface of the detection part; electrically connecting the detection part to the substrate via the second face part; adding a resin into the housing through the opening part of the housing; and inserting the detection part into the housing through the opening part of the housing and moving the detection part to the other end side of the housing while bending the side face part of the detection part shield from the first face part to cover the side surface of the detection part due to the insertion.

According to this aspect, in the method of assembling the proximity sensor, since the side face part of the detection part shield that covers the side surface of the detection part is configured of the plurality of side pieces connected to the outer periphery of the first face part that adheres to the front surface of the detection part, positional displacement due to the reaction force of the resin present around the detection part is inhibited.

Effects

The present invention provides a proximity sensor in which positional displacement of a shield member that covers a periphery of a detection part is inhibited.

DESCRIPTION OF THE EMBODIMENTS

Figure 1:
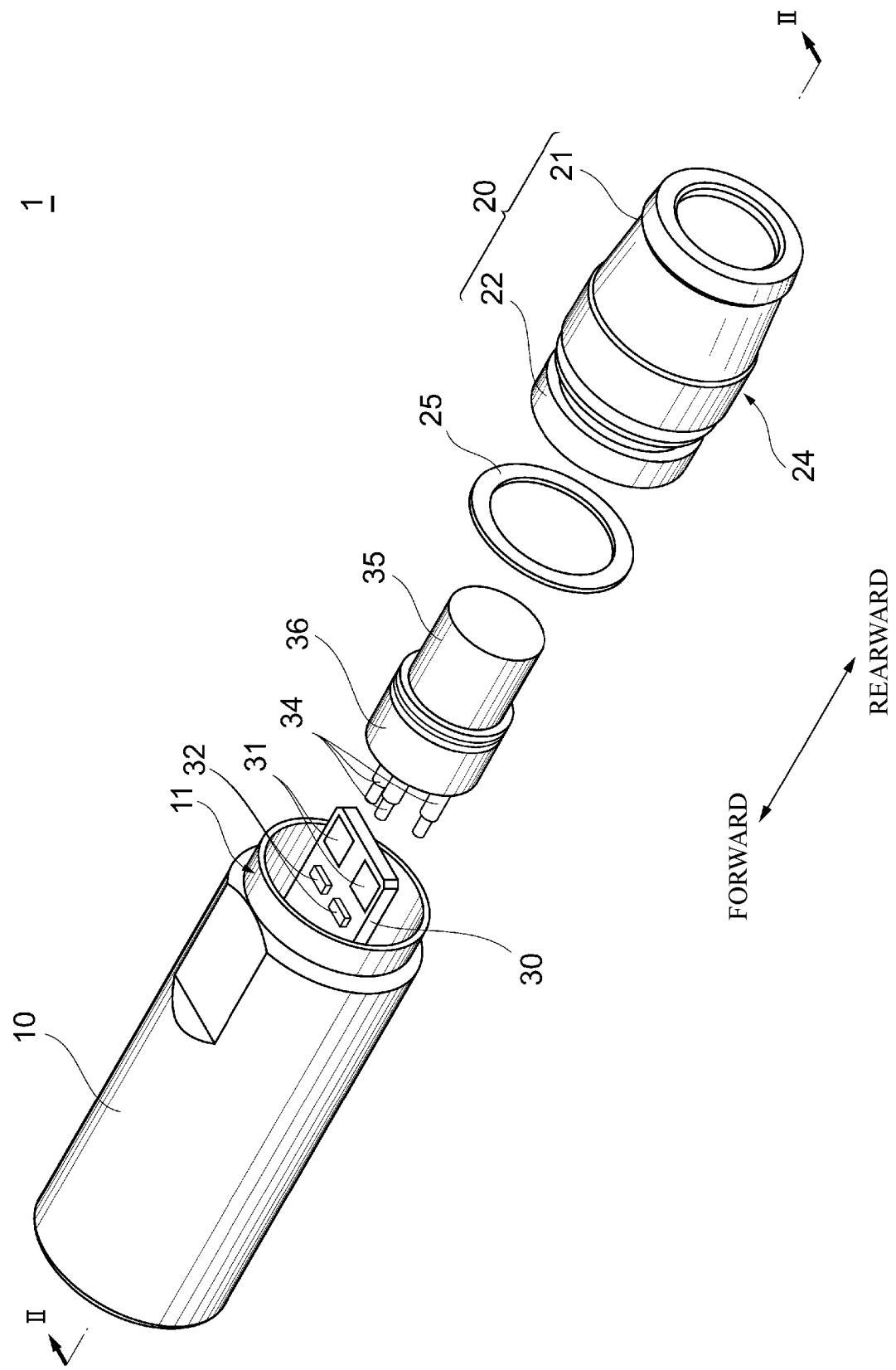
FIG. 1 is an exploded perspective view showing a proximity sensor according to a first embodiment of the present invention.

Embodiments of the present invention will be described with reference to the accompanying drawings. Also, in each figure, those having the same reference numerals have the same or similar configurations.

First Embodiment

Figure 2:
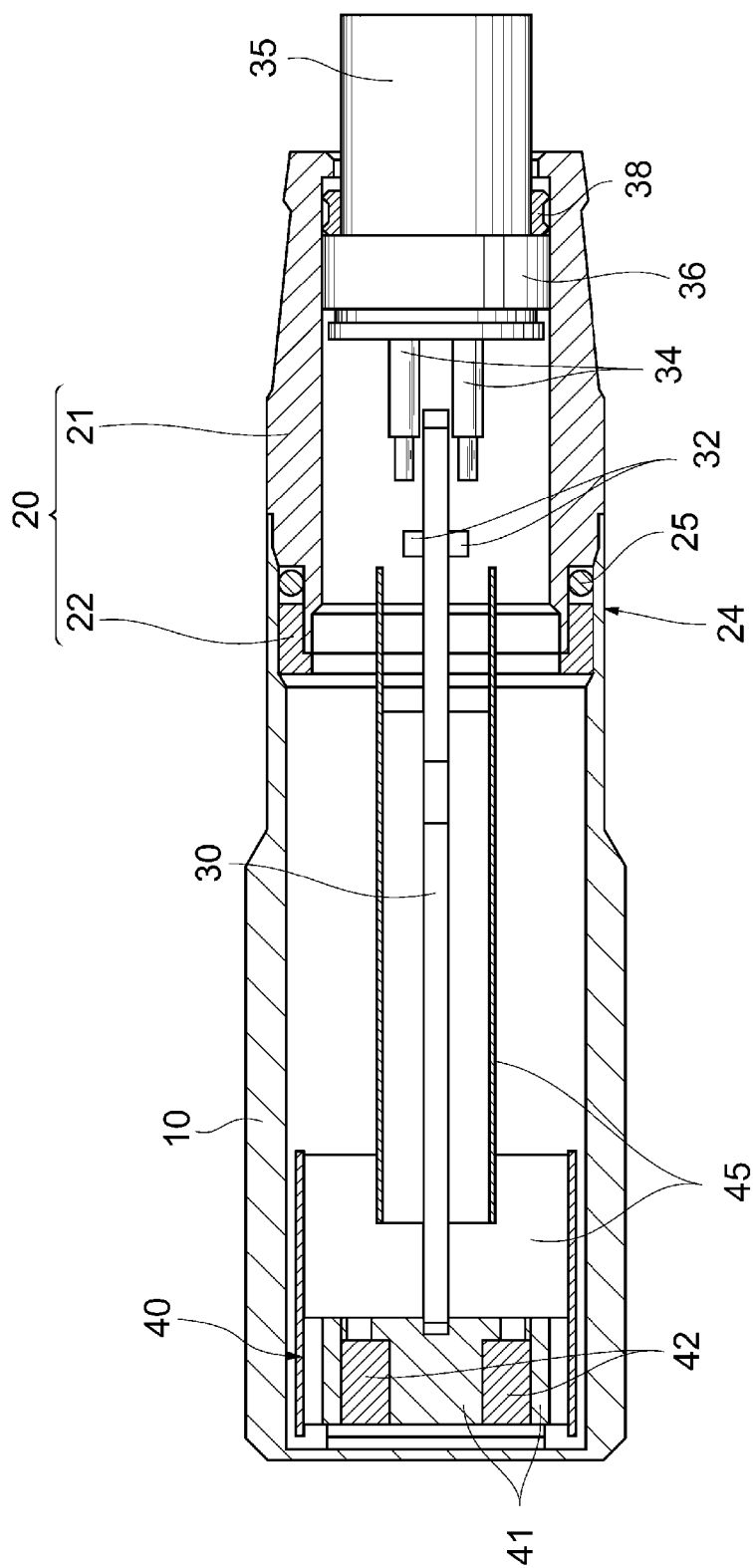
FIG. 2 is a cross-sectional view along line II-II in a state in which the sensor shown in FIG. 1 has been assembled.

An internal structure of a sensor 1 will be described with reference to FIGS. 1 and 2. FIG. 1 is an exploded perspective view of the sensor 1 according to a first embodiment of the present invention (hereinafter, simply referred to as the "first embodiment"). FIG. 2 is a cross-sectional view of line II-II in a state in which the sensor 1 shown in FIG. 1 has been assembled.

The sensor 1 according to the first embodiment is a proximity sensor which can detect that a detection target has approached in a non-contact manner, and which includes a housing 10, a clamp 20, an O-ring 25, a substrate 30, cable strands 34, a cable 35, a ring component 36, a detection part 40, and a shield 45. The housing 10 is formed in a cylindrical shape, and electronic components such as a substrate 30 are housed therein. The housing 10 has an opening part 11 at one end thereof, and the electronic components such as the substrate 30 are inserted through the opening part 11. The housing 10 may be made of a metal, a resin, or the like. An outer shape of the sensor 1 is cylindrical, but an outer circumference of the housing 10 or the clamp 20 may be a prismatic shape having a polygonal shape.

An end part of the clamp 20 is connected to the opening part 11 of the housing 10 to protect the electronic components such as the substrate 30 housed in the housing 10. As shown by the arrow in FIG. 1, when a direction from the clamp 20 to the housing 10 is defined as forward and a direction from the housing 10 to the clamp 20 is defined as rearward in an axial direction of the sensor 1, a front part of the clamp 20 is inserted into the housing 10 through the opening part 11 as shown in FIG. 2. Most of regions of the substrate 30 are housed in the housing 10, but a rear region of the substrate 30 is housed in the clamp 20. Further, parts of the cable strands 34, the ring component 36, and the cable 35 are housed in the clamp 20.

The clamp 20 includes a first component 21 and a second component 22 having cylindrical shapes. Specifically, a front end part of the first component 21 is fitted into the second component 22. The clamp 20 has a recessed part 24 between the first component 21 and the second component 22, and the O-ring 25 is attached to the recessed part 24. As shown in FIG. 2, the O-ring 25 is located inside the housing 10 in a state in which the sensor 1 has been assembled and seals a gap between an inner wall of the housing 10 and an outer wall of the clamp 20.

The clamp 20 (the first component 21 and the second component 22) can be formed of a resin, a metal, or the like, but it is preferably formed of a transparent material that transmits visible light so that an indicator lamp 32 located inside the sensor 1 can be visually recognized from the outside.

The substrate 30 is a substrate on which a control circuit (not shown) for controlling the detection part 40 and a current supply circuit (not shown) for supplying current to the detection part 40 are mounted, and a part thereof is housed in the housing 10. As shown in FIG. 2, the detection part 40 is attached to the front end part of the substrate 30. The detection part 40 detects the presence or absence of a detection target in a non-contact manner. The detection part 40 includes a core 41 in which a coil 42 is housed, and the coil 42 wound in an annular shape. On the other hand, lands 31 are provided at a rear end part of the substrate 30 and are electrically connected to the cable strands 34. Here, a method for detecting the detection target using the sensor 1 will be described. First, an excitation current is supplied to the coil 42 from the current supply circuit mounted on the substrate 30. The coil 42 generates a magnetic field on the basis of the supplied excitation current. When the detection target such as a metal target approaches the coil 42 in this state, an eddy current is generated inside the detection target according to the law of electromagnetic induction. Since this eddy current generates a magnetic field, the magnetic flux penetrating the coil 42, and thus the impedance of the coil 42, changes. The control circuit connected to the detection part 40 measures the change in the impedance of the coil 42 and detects the presence or absence of a detection target.

The indicator lamp 32 for displaying an operating state of the sensor 1 is mounted on the substrate 30. The indicator lamp 32 may be, for example, an LED or the like. In the present embodiment, the indicator lamp 32 is turned on when the power of the sensor 1 is turned on or when the sensor 1 detects a detection target.

The cable 35 is obtained by applying a protective coating to a plurality of cable strands 34. The cable strands 34 are electrically connected to the lands 31 of the substrate 30. The cable strands 34 may supply electric power from an external power source to a circuit mounted on the substrate 30. Further, the cable strands 34 may transmit output signals from the control circuit mounted on the substrate 30 to an external device such as an amplifier.

The ring component 36 is provided on an outer circumference of the cable 35 to prevent the cable 35 from being damaged. Specifically, the ring component 36 is formed by injection molding or the like at a position covering an end part of the protective coating on the cable 35. Further, the ring component 36 is in close contact with a sealing resin filled inside the housing 10, and fixed the cable 35 to the clamp 20.

A sealing ring 38 is provided between the cable 35 and the first component 21 and in a region behind the ring component 36 to surround the cable 35. The sealing ring 38 seals a gap between an inner wall of the clamp 20 and the outer circumference of the cable 35. The sealing ring 38 prevents a liquid or dust from entering from the outside of the sensor 1. Further, the sealing ring 38 prevents the sealing resin filled inside the sensor 1 from leaking to the outside.

The shield 45 prevents noise from entering from the outside. The shield 45 is provided to cover at least a part of the detection part 40 and the substrate 30 to prevent noise from reaching the detection part 40 and the substrate 30. The shield 45 may be formed of, for example, a metal film or a laminated member of a copper foil and a polyimide resin.

Figure 3:
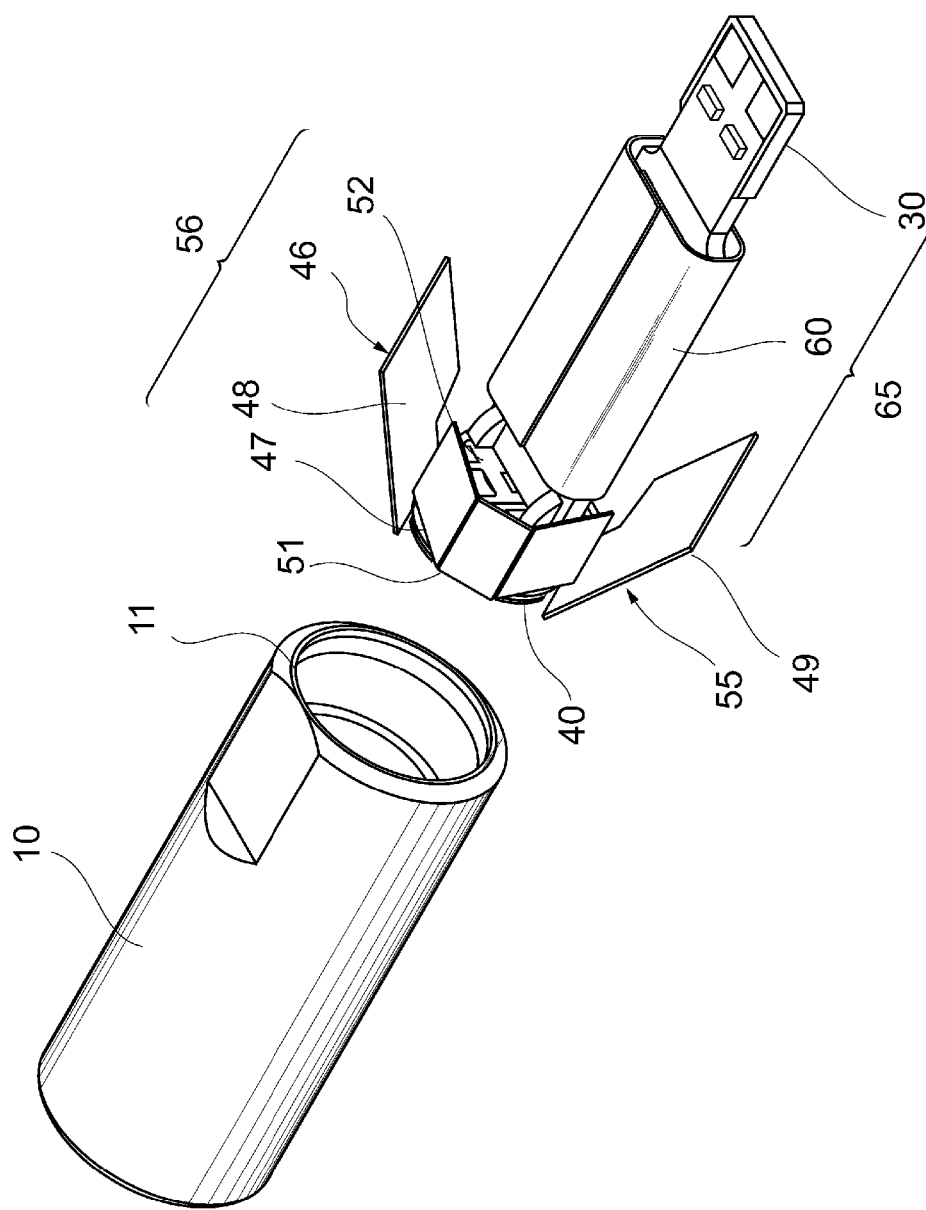
FIG. 3 is an exploded perspective view showing a housing, a detection unit, and a substrate unit of the sensor shown in FIGS. 1 and 2.

Configurations of the housing 10, the detection part 40, the shield 45, and the substrate 30 of the sensor 1 will be described with reference to an exploded perspective view of FIG. 3. As shown in FIG. 3, the shield 45 is configured of a detection part shield 55 that covers a periphery of the detection part 40 and a substrate shield 60 that covers a periphery of the substrate 30.

The detection part shield 55 prevents noise from entering the detection part 40 from the outside. In addition, the detection part shield 55 has a first face part 51 which adheres to a front surface of the detection part 40 located on the other end side (front side) of the housing 10 to cover the front surface, and a side face part 46 configured of a first side piece 47, a second side piece 48, a third side piece 49, and a fourth side piece 50 (see FIG. 4). Further, the detection part shield 55 may have a second face part 52 which is connected to an outer periphery of the side face part 46 and adheres to a back surface facing the front surface of the detection part 40.

The side face part 46 is connected to an outer periphery of the first face part 51, is bent from the first face part 51, and is housed in the housing 10. Specifically, when the detection part shield 55 is inserted into the housing 10 together with the detection part 40, the side face part 46 is bent from the first face part 51 by the opening part 11 or the inner wall of the housing 10. Hereinafter, an assembled part in which the detection part 40 and the detection part shield 55 covering the periphery of the detection part 40 are integrally assembled is referred to as a "detection unit 56."

The substrate shield 60 prevents noise from entering the substrate 30 from the outside. Also, in the present example, the substrate shield 60 is configured as a separate body from the detection part shield 55, but may be integrally configured by being connected to the detection part shield 55. Hereinafter, an assembled component in which the substrate 30 and the substrate shield 60 covering the periphery of the substrate 30 are integrally assembled is referred to as a "substrate unit 65."

The detection unit 56 and the substrate unit 65 are integrally housed in the housing 10 through the opening part 11. The substrate unit 65 is fixed behind the detection unit 56. By fixing the detection unit 56 and the substrate unit 65 in this way, they are assembled into an intermediate assembly component. Further, the intermediate assembly component is inserted into the housing 10 and fixed with a resin or the like provided inside the housing 10 to be assembled with the housing 10.

The detection unit 56 and the substrate unit 65 are mechanically fixed and electrically connected in the state of the intermediate assembly component. Specifically, the detection part 40 (coil 42) of the detection unit 56 and the control circuit of the substrate unit 65 are electrically connected by relaying of the second face part 52. Further, along with the realization of the electrical connection, the detection part 40 and the substrate 30 are mechanically fixed via the second face part 52. In the connection and fixing, for example, lands as bonding electrodes may be provided on the second face part 52 and the substrate 30 that adhere to the back surface of the detection part 40, and the corresponding lands on the second face part 52 and the substrate 30 may be connected to each other by soldering. Further, the second face part electrically connects the detection part shield 55 to the substrate 30 (for example, to 0 V potential of the circuit of the substrate 30). According to such a configuration, the detection part shield 55 can electrically connect the coil 42 of the detection part 40 with the control circuit of the substrate 30. Also, the detection part shield 55 may not have the second face part 52, and for example, the side face part 46 may electrically connect the detection part shield 55 to the substrate 30 instead of the second face part 52, and may electrically connect the detection part 40 with the substrate 30.

At least a part of a space inside the housing 10 may be filled with a resin. The detection unit 56, the substrate unit 65, and the like are sealed by the filled resin. The sealing with the resin prevents moisture, oil, or the like from entering the space inside the housing 10 from the outside and also prevents damage to internal components in a vibrating environment. In the present example, in the sensor 1, the resin is poured into a part of the other end side of the housing 10, and the resin is provided around the detection unit 56 housed in the housing 10.

According to the above configuration, in the sensor 1, the side face part 46 of the detection part shield 55 that covers the side surface of the detection part 40 is configured of a plurality of side pieces connected to the outer periphery of the first face part 51 that adheres to the front surface of the detection part 40, and thus positional displacement due to a reaction force of the resin present around the detection part 40 is inhibited.

Figure 4:
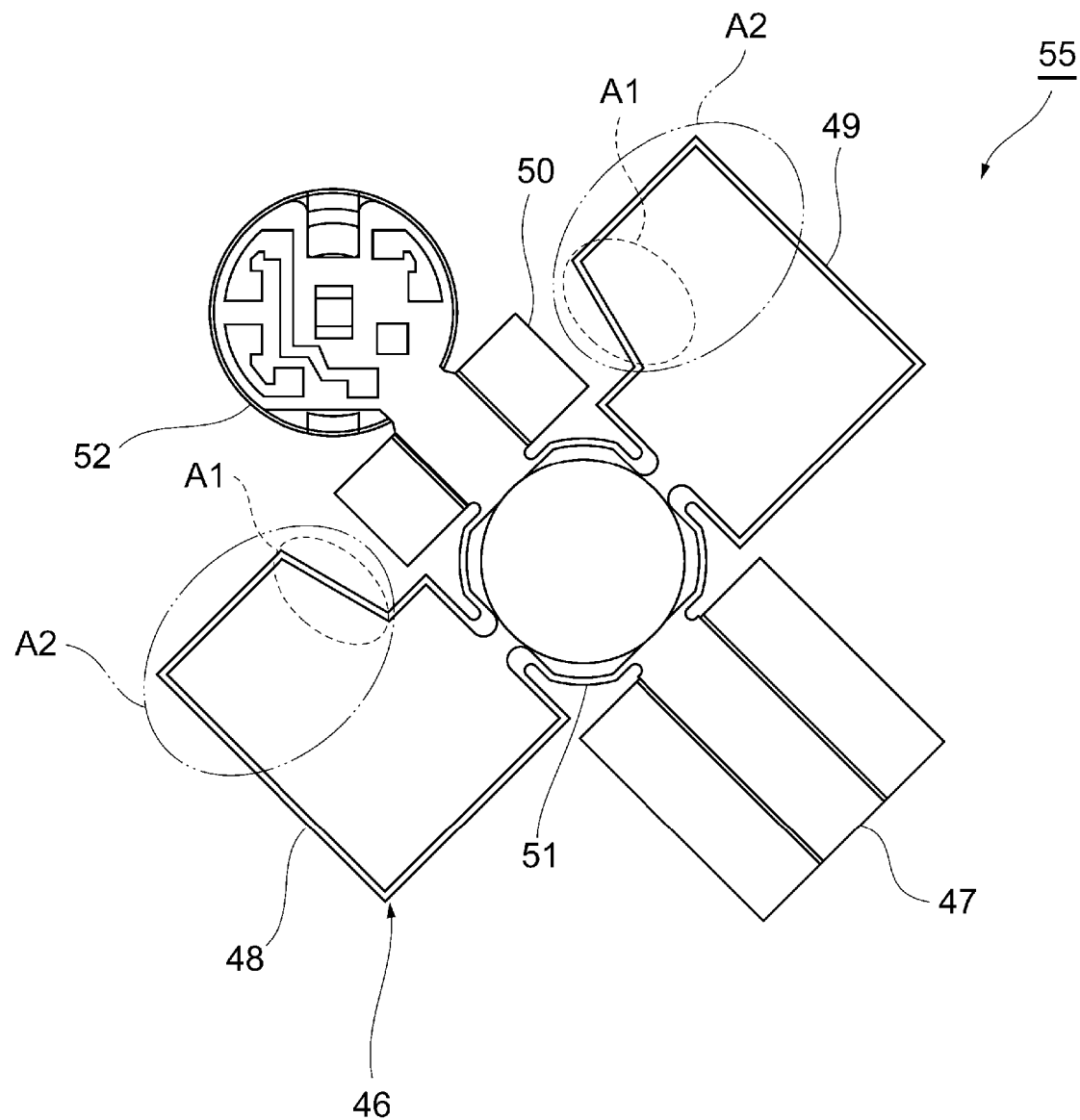
FIG. 4 is a developed view of a surface side of a detection part shield of the sensor shown in FIGS. 1 and 2.

A configuration of the detection part shield 55 will be described with reference to FIG. 4. FIG. 4 is a developed view of a surface side of the detection part shield 55 (a side facing an inner circumference of the housing 10).

As shown in FIG. 4, the detection part shield 55 has the first face part 51, the side face part 46, and the second face part 52. The side face part 46 is configured of a plurality of side pieces connected to the outer periphery of the first face part 51. The plurality of side pieces is provided in four and are configured of a first side piece 47, a second side piece 48, a third side piece 49, and a fourth side piece 50. Hereinafter, the first side piece 47, the second side piece 48, the third side piece 49, and the fourth side piece 50 are collectively referred to as the "plurality of side pieces." The second face part 52 is connected to an outer edge of the fourth side piece 50 on one end side (substrate 30 side) in the axial direction.

Centers of connection places of the plurality of side pieces with the first face part 51 are located on the outer periphery of the first face part 51 at substantially equal intervals. In other words, the plurality of side pieces has a structure that extends radially from the first face part 51.

In the present example, four side pieces are provided, but the number of side pieces is not limited to four. For example, the plurality of side pieces may be provided in two and connected to the outer periphery of the first face part 51 to face each other. With such a configuration, the plurality of side pieces can form the side face part in a well-balanced manner with the minimum number of components. Further, three or more side pieces may be provided and may be connected to the outer periphery of the first face part 51 at substantially equal intervals. With such a configuration, the plurality of side pieces can form the side face part in a well-balanced manner.

Lengths of the first side piece 47, the second side piece 48, and the third side piece 49 in the axial direction of the housing 10 are set to be longer than a length of the side surface of the detection part 40 in the axial direction. Further, a length of the fourth side piece 50 connected to the second face part 52 in the axial direction may be substantially the same as a length of the side surface of the detection part 40 in the axial direction.

The first side piece 47 and the fourth side piece 50 of one set of the side pieces facing each other may have folds extending in the axial direction. The first side piece 47 and the fourth side piece 50, which are one set of the side pieces facing each other, may be folded along the folds and may be located on an inner side than the second side piece 48 and the third side piece 49 of the other set facing each other. With such a configuration, when the detection unit 56 is inserted into the housing 10, the plurality of side pieces can be naturally folded to cover the side surface of the detection part 40.

At least some of outer edges of the plurality of side pieces on the first face part 51 side may be inclined such that a distance thereof from the first face part 51 increases. Specifically, parts of the outer edges of the second side piece 48 and the third side piece 49 on the first face part 51 side (outer edge parts in areas A1 surrounded by broken lines in FIG. 4) may be inclined such that distances thereof from the first face part 51 increase with respect to an outer edge of the first face part 51.

Figure 5:
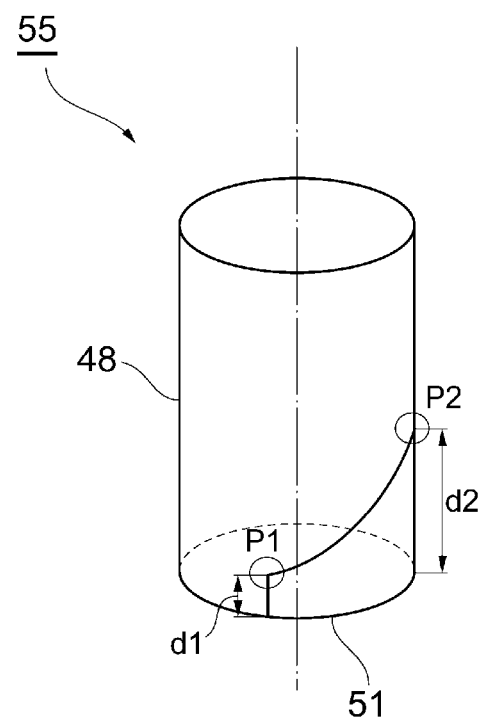
FIG. 5 is a diagram for explaining an inclined shape of a side piece of the detection part shield of the sensor shown in FIGS. 1 and 2.

Here, with reference to FIG. 5, an inclination of the parts of the outer edges of the second side piece 48 and the third side piece 49 on the first face part 51 side will be described. Also, in the example of FIG. 5, the second side piece 48 will be used for explanation, but the same applies to the third side piece 49. As shown in FIG. 5, the outer edge of the second side piece 48 has a part ranging from a start point P1 to an end point P2 inclined with respect to the outer edge of the first face part 51. Due to this inclination, a distance d2 between the end point P2 and the first face part 51 becomes larger than a distance d1 between the start point P1 and the outer edge of the first face part. Due to the difference in distance, when the detection unit 56 is inserted into the housing 10, the second side piece 48 is gradually immersed in the resin in the housing 10 from the start point P1 to the end point P2 and wound along the side surface of the detection part 40. Therefore, with such a configuration, the side piece can be easily wound along the side surface of the detection part 40.

The explanation will be continued by returning to FIG. 4. The second side piece 48 and the third side piece 49, which are two side pieces adjacent to the fourth side piece 50 connected to the second face part 52, may have regions extending in a direction orthogonal to the axial direction (regions in areas A2 surrounded by alternate long and short dash lines in FIG. 4) formed on the fourth side piece 50 side. The regions are disposed on the substrate 30 side of the fourth side piece 50 in the axial direction when the second side piece 48 and the third side piece 49 are bent from the first face part 51. With such a configuration, when the second side piece 48 and the third side piece 49 are folded outward from the fourth side piece 50, a length of the fourth side piece 50 on the substrate 30 side in the axial direction is shorter than those of other side pieces, but this can be compensated for.

Figure 6A:
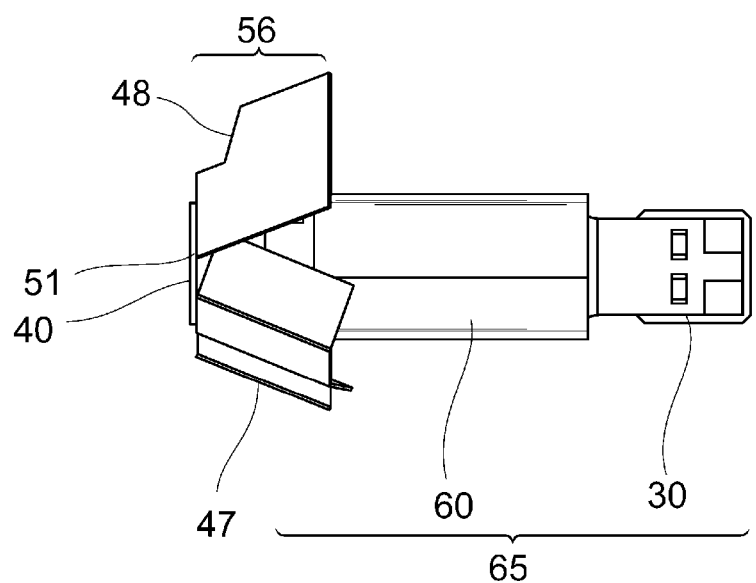
FIG. 6A is a front view showing the detection unit and the substrate unit of the sensor shown in FIGS. 1 and 2.
Figure 6B:
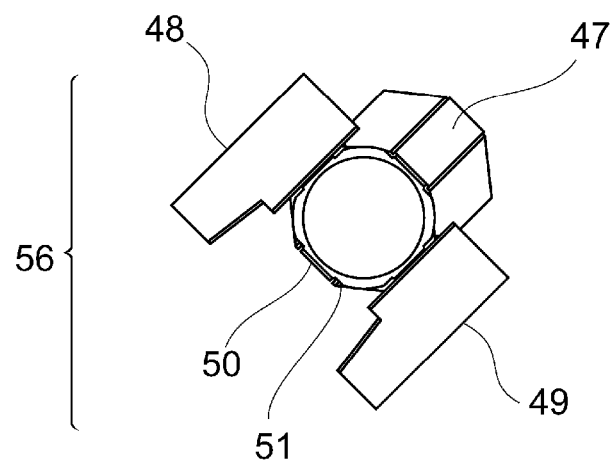
FIG. 6B is a bottom view showing the detection unit and the substrate unit of the sensor shown in FIGS. 1 and 2.
Figure 6C:
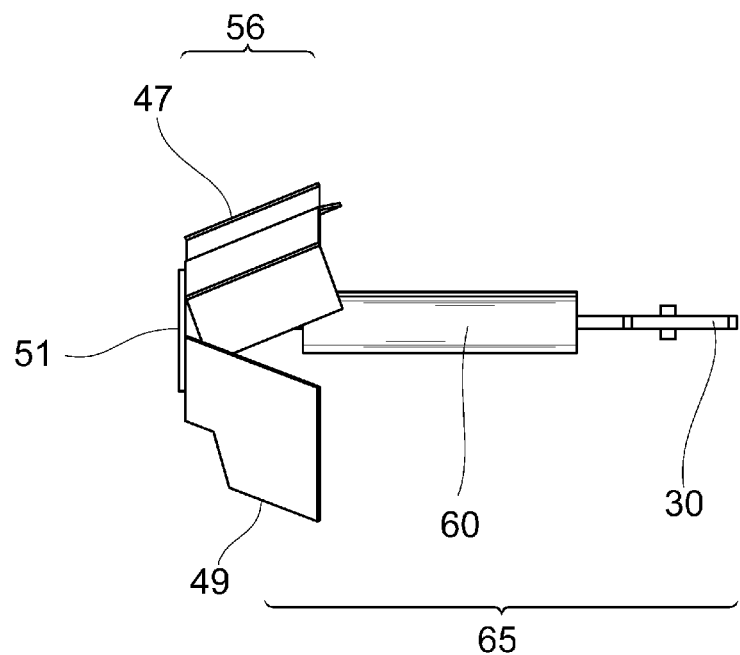
FIG. 6C is a side view showing the detection unit and the substrate unit of the sensor shown in FIGS. 1 and 2.

Configurations of the detection unit 56 and the substrate unit 65 will be described with reference to FIGS. 6A to 6C. FIG. 6A is a front view showing the detection unit 56 and the substrate unit 65. FIG. 6B is a bottom view showing the detection unit 56 and the substrate unit 65. FIG. 6C is a side view showing the detection unit 56 and the substrate unit 65.

As shown in FIGS. 6A and 6C, the first side piece 47, the second side piece 48, and the third side piece 49 are bent from the first face part 51 that adheres to the front surface of the detection part 40 to cover the side surface of the detection part 40. In this adhesion, for example, the first face part 51 may adhere and be fixed to the front surface of the core 41 of the detection part 40. Further, the plurality of side pieces may be formed such that a part of a region on the substrate 30 side overlaps the substrate shield 60. With such a configuration, the shield 45 can prevent noise from entering from the outside more tightly.

As shown in FIG. 6A, two adjacent first side pieces 47 and second side piece 48 may have regions that overlap each other. Also, as shown in FIG. 6C, the two adjacent first side pieces 47 and the third side piece 49 may have regions that overlap each other. Further, the first side piece 47 may have a fold extending in the axial direction, or the first side piece 47 may be folded along the fold and the overlapping region of the first side piece 47 may be located inward from the overlapping regions of the second side piece 48 and the third side piece 49. With such a configuration, when the detection unit 56 is inserted into the housing 10, the first side piece 47, the second side piece 48, and the third side piece 49 are disposed such that the overlapping regions of the second side piece 48 and the third side piece 49 wrap the overlapping region of the first side piece 47 from the outside.

As shown in FIG. 6B, the plurality of side pieces is connected to the outer periphery of the first face part 51. Also, the plurality of side pieces may be radially connected to the outer periphery of the first face part 51. Further, the fourth side piece 50 may be bent in advance to be in close contact with a peripheral surface of the detection part 40 before the detection unit 56 is inserted into the housing 10. Specifically, when the first face part 51 and the second face part 52 adhere to the front surface and the back surface of the detection part 40, the fourth side piece 50 is naturally bent from the first face part 51 to cover the side surface of the detection part 40.

An assembly method of the housing 10, the detection unit 56, and the substrate unit 65 will be described with reference to FIGS. 3 and 7A to 7D.

Figure 7A:
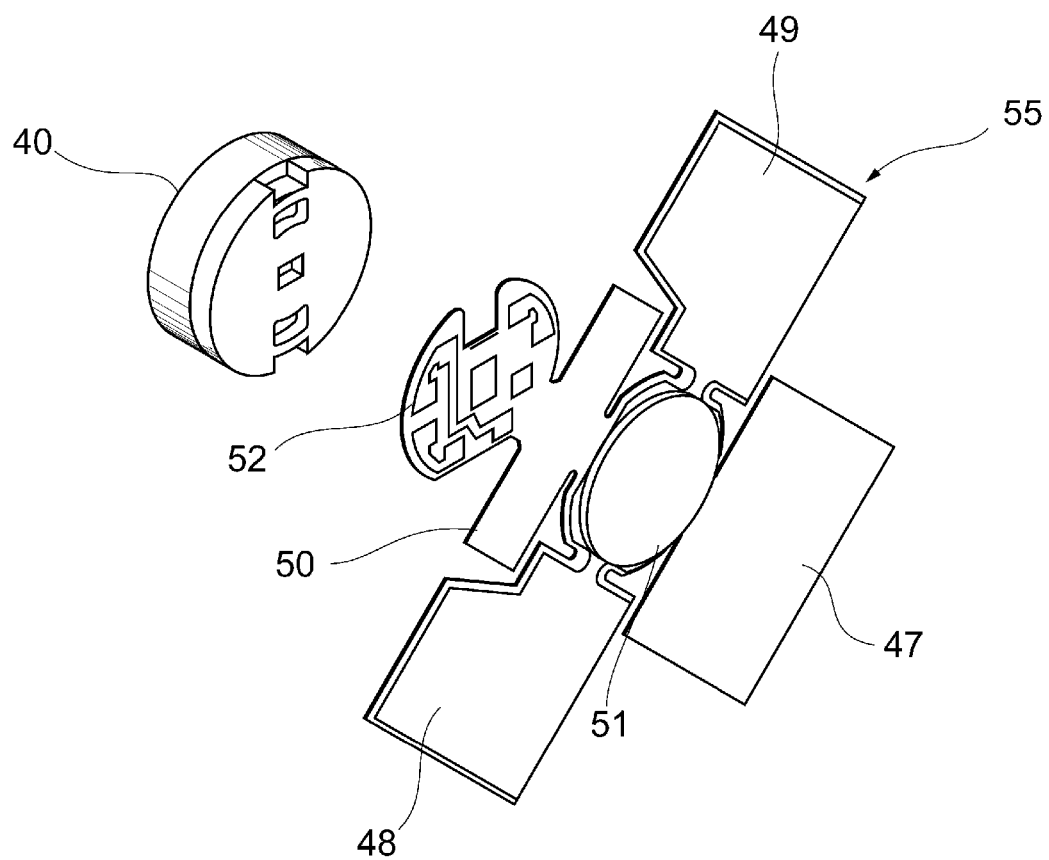
FIG. 7A is a diagram for explaining an assembly method of for realizing configurations of the detection unit and the substrate unit shown in FIGS. 6A to 6C.
Figure 7B:
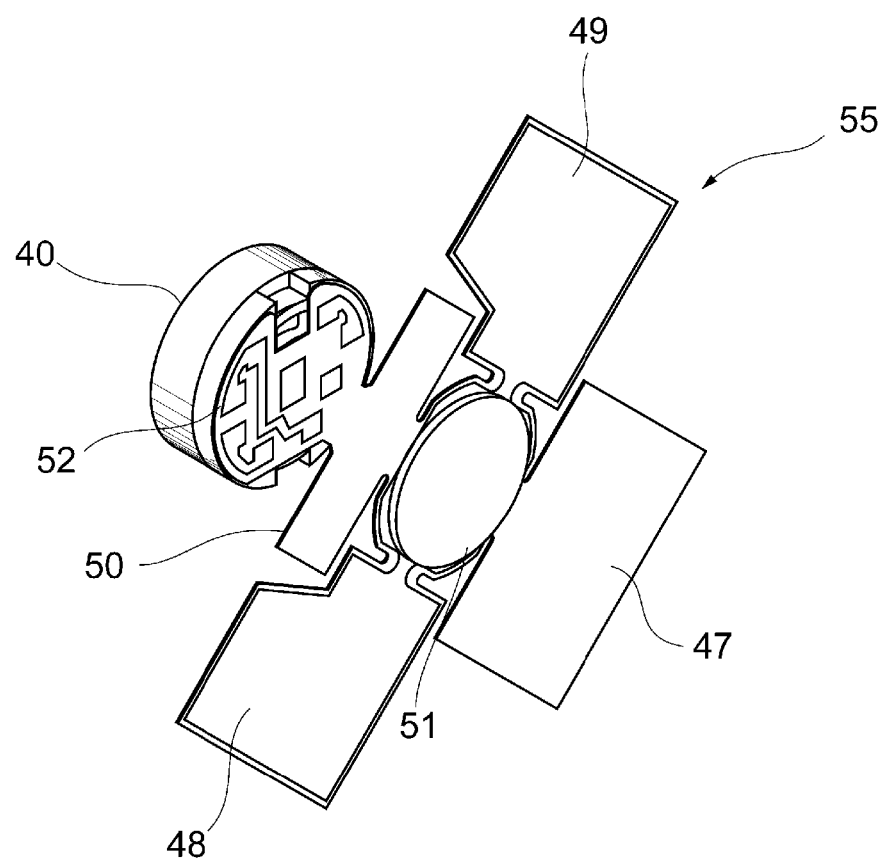
FIG. 7B is a diagram for explaining the assembly method of for realizing the configurations of the detection unit and the substrate unit shown in FIGS. 6A to 6C.

(1) First, as shown in FIGS. 7A and 7B, the second face part 52 of the detection part shield 55 is attached to the back surface of the detection part 40 to cover the back surface.

Figure 7C:
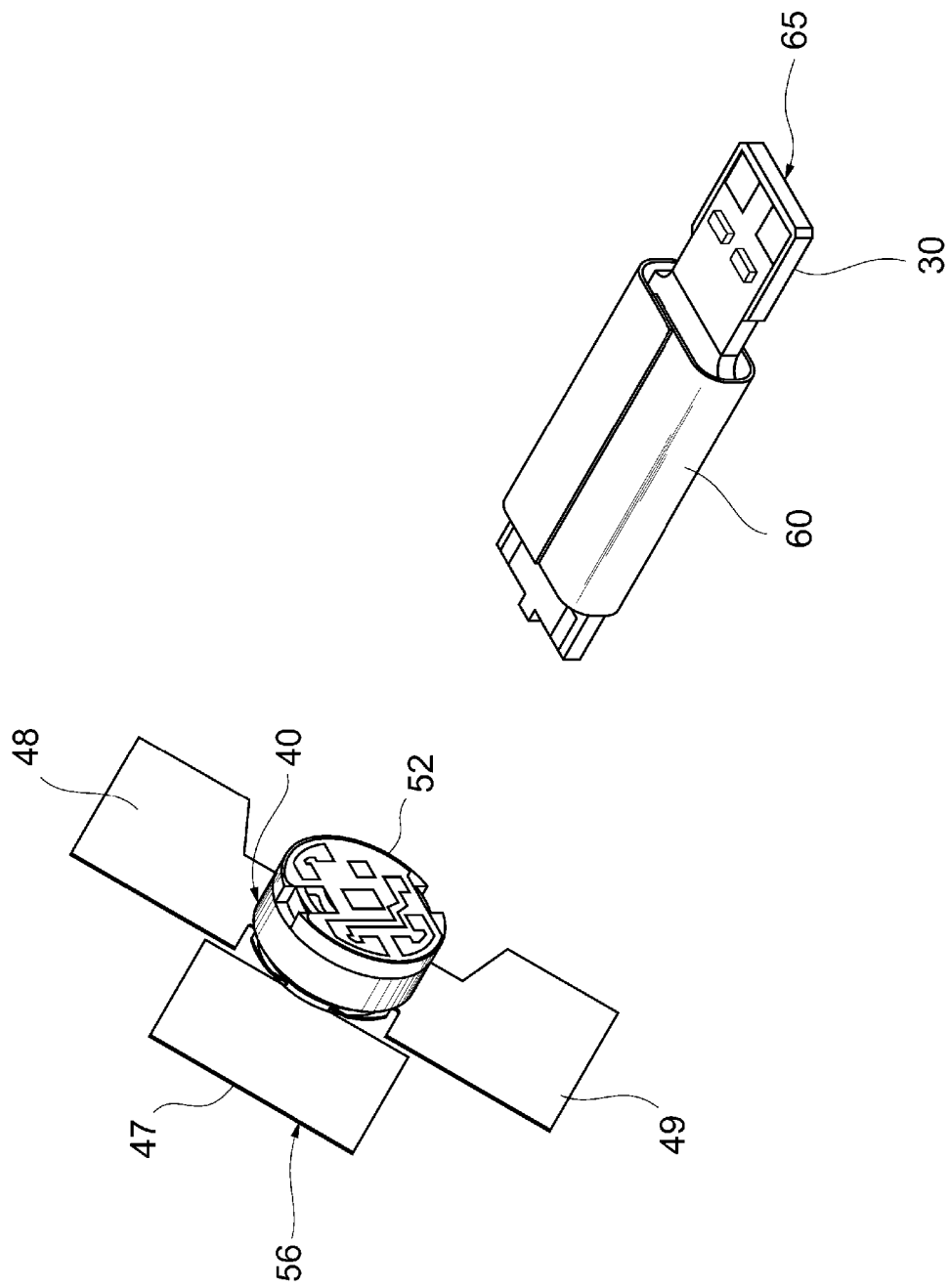
FIG. 7C is a diagram for explaining the assembly method of for realizing the configurations of the detection unit and the substrate unit shown in FIGS. 6A to 6C.

(2) Next, as shown in FIG. 7C, the first face part 51 of the detection part shield 55 adheres to the front surface of the detection part 40 to cover the front surface. Also, the order of the step the above step (1) may be reversed. In this way, the first face part 51 and the second face part 52 adhere to the front surface and the back surface of the detection part 40 to assemble the detection unit 56.

Figure 7D:
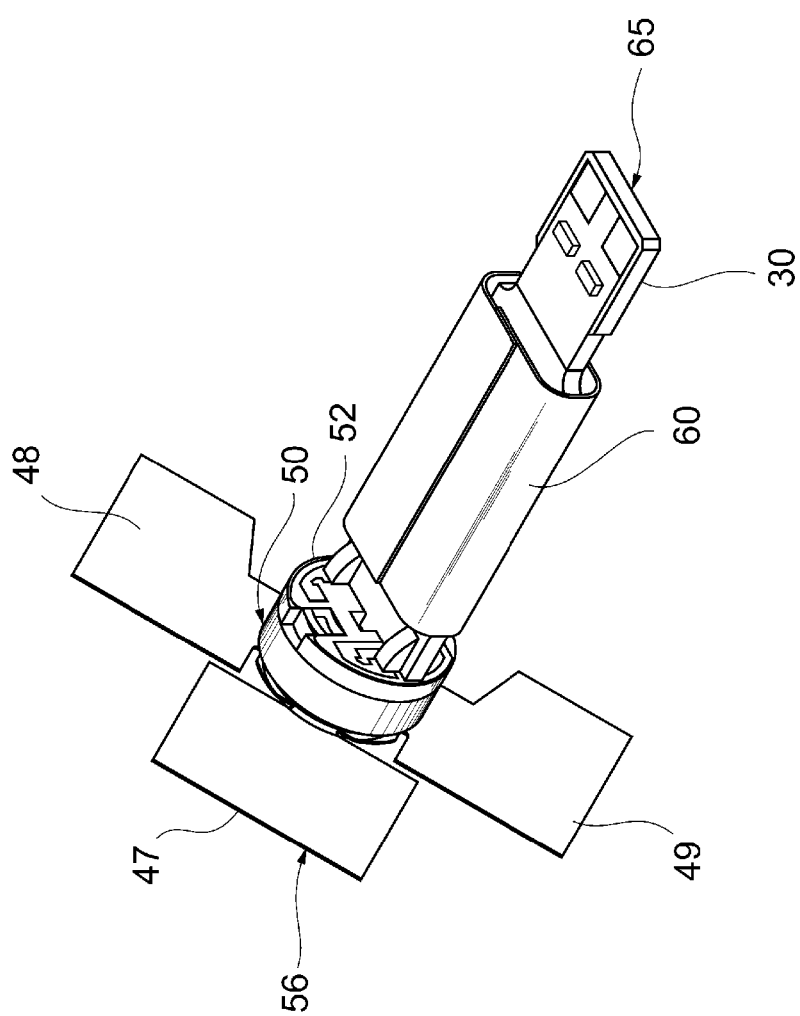
FIG. 7D is a diagram for explaining the assembly method of for realizing the configurations of the detection unit and the substrate unit shown in FIGS. 6A to 6C.

(3) Next, as shown in FIGS. 7C and 7D, the detection unit 56 and the substrate unit 65 are electrically connected by soldering the second face part 52 and the substrate 30, and the substrate unit 65 is fixed to a rear side of the detection unit 56. By fixing in this way, the detection unit 56 and the substrate unit 65 are assembled into the intermediate assembly component.

(4) Next, the resin is put (poured) into the housing 10 through the opening part 11 of the housing 10.

(5) Next, as shown in FIG. 3, the intermediate assembly component including the detection part 40 and the detection part shield 55 is inserted through the opening part 11 of the housing 10, and the intermediate assembly component is moved to the other end side of the housing 10 while the side face part 46 of the detection part shield 55 is bent from the first face part 51 to cover the side surface of the detection part 40 due to the insertion. Further, at the time of the movement, the detection part 40 and the detection part shield are pushed into the resin in the housing 10 and disposed on the front side of the housing 10.

(6) Finally, the resin is cured in a state in which the resin is present around the detection part 40 and the detection part shield 55.

According to the above steps (1) to (6), in the method of assembling the sensor 1, since the side face part 46 of the detection part shield 55 is configured of the plurality of side pieces connected to the outer periphery of the first face part 51, the positional displacement due to the reaction force of the resin present around the detection part 40 is inhibited.

Second Embodiment

Next, a second embodiment of the present invention will be described. As compared with the first embodiment, the second embodiment has a form in which adhesive parts are provided on the side face part 46 of the detection part shield 55, and the plurality of side pieces is adhesively fixed to each other by the adhesive parts in advance before they are inserted into the housing 10. Hereinafter, the points different from those of the first embodiment will be mainly described.

Figure 8:
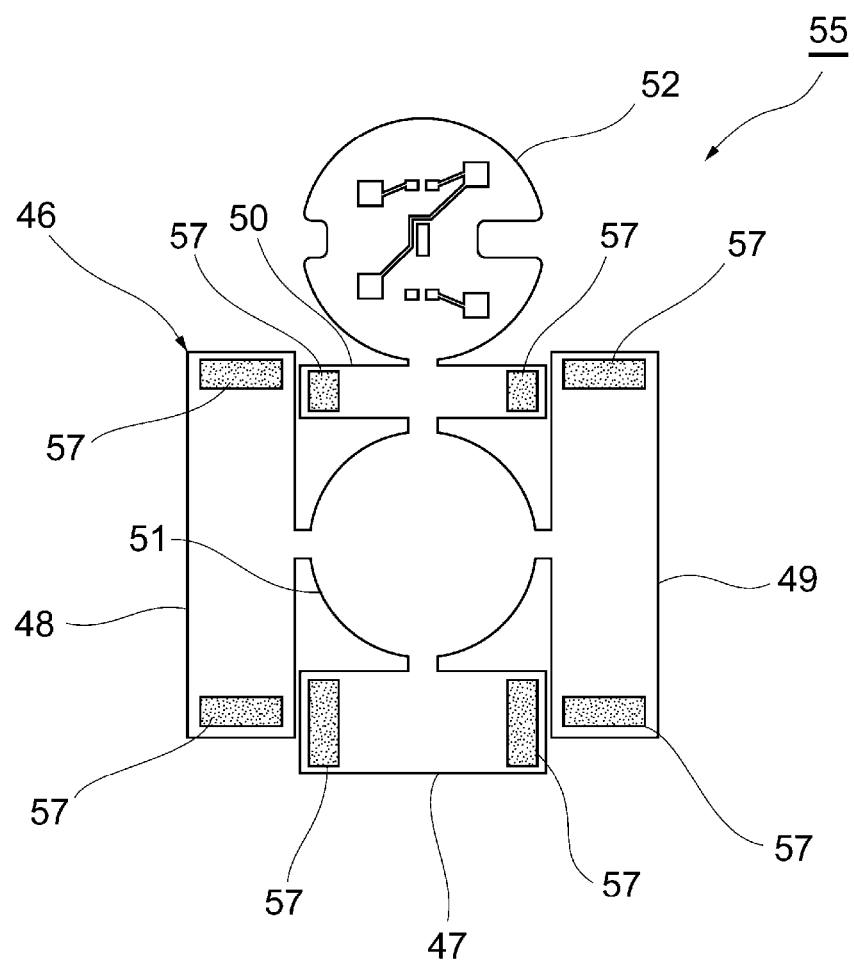
FIG. 8 is a developed view of a surface side of a detection part shield of a sensor according to a second embodiment of the present invention.

A configuration of the detection part shield 55 according to the second embodiment will be described with reference to FIG. 8. FIG. 8 is a developed view of a surface side of the detection part shield 55 according to the second embodiment.

As shown in FIG. 8, the plurality of side pieces has regions that overlap each other when two adjacent side pieces are bent from the first face part. The two adjacent side pieces adhere to each other in the overlapping regions. The two adjacent side pieces adhere to each other, for example, due to adhesive parts 57 provided in the overlapping regions. The adhesive parts 57 are, for example, adhesives or double-sided tapes. In the present example, in the regions in which the two adjacent side pieces overlap each other, the adhesive parts 57 are provided in both regions, but they may be provided in either region. With such a configuration, the side pieces of the side face part 46 can be brought into close contact with each other.

Figure 9:
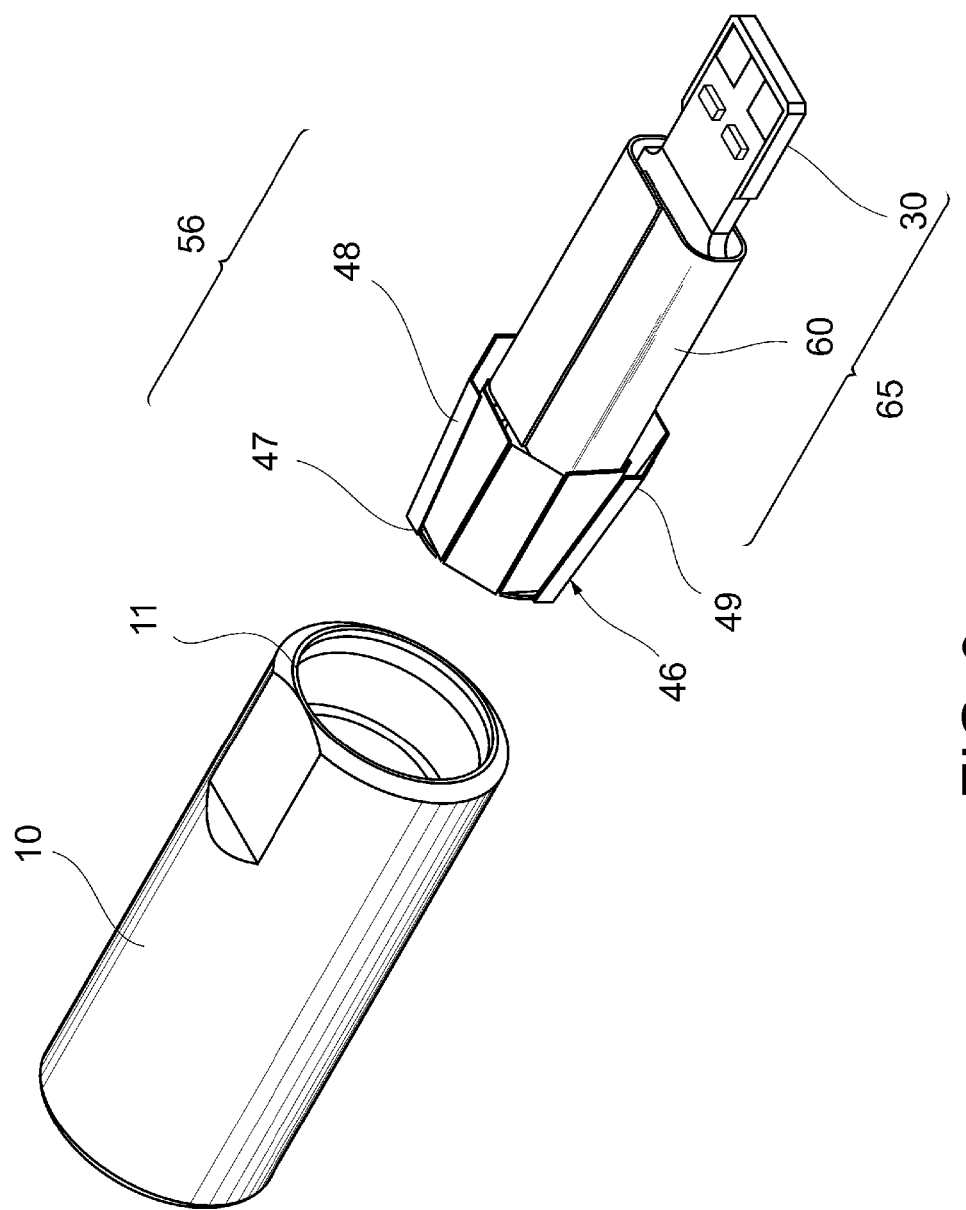
FIG. 9 is an exploded perspective view showing a housing, a detection unit, and a substrate unit of the sensor according to the second embodiment of the present invention.

Configurations of the detection unit 56 and the substrate unit 65 according to the second embodiment will be described with reference to FIG. 9A and FIGS. 10A to 10D. As shown in FIG. 9, the plurality of side pieces of the side face part 46 of the detection part shield 55 adheres to each other due to the adhesive parts 57 (see FIG. 8) provided at both left and right ends with respect to the axial direction of the plurality of side pieces and are folded. Specifically, the overlapping region of the first side piece 47 is located inward from the overlapping regions of the second side piece 48 and the third side piece 49 and is adhesively fixed by the adhesive parts 57 in these overlapping regions. With such a configuration, the side face part 46 can bring the side pieces in closer contact with each other.

Figure 10A:
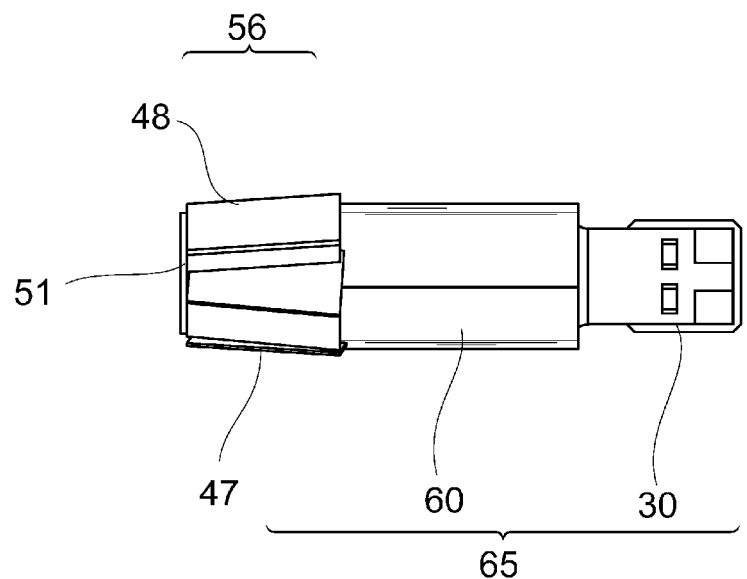
FIG. 10A is a front view showing the detection unit and the substrate unit of the sensor shown in FIG. 9.
Figure 10B:
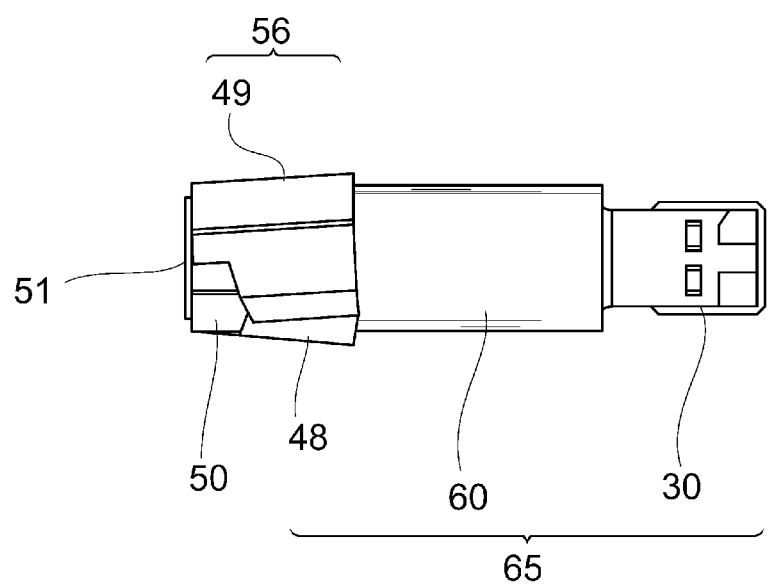
FIG. 10B is a rear view showing the detection unit and the substrate unit of the sensor shown in FIG. 9.

As shown in FIGS. 10A to 10D, the plurality of side pieces of the side face part 46 according to the second embodiment is bent in advance from the first face part 51, and the adjacent side pieces are adhesively fixed to each other by the adhesive parts 57. As shown in FIG. 10A, the first side piece 47 and the second side piece 48 are folded and adhesively fixed to each other such that the first side piece 47 is located inward from the second side piece 48. Also, as shown in FIG. 10B, the second side piece 48, the third side piece 49, and the fourth side piece 50 are folded and adhesively fixed to each other such that the fourth side piece 50 is located inward from the second side piece 48 and the third side piece 49. Further, parts of regions of the second side piece 48 and the third side piece 49 are located outward from the fourth side piece 50 to compensate for the shortage of the length of the fourth side piece 50 on the substrate 30 side in the axial direction.

Figure 10C:
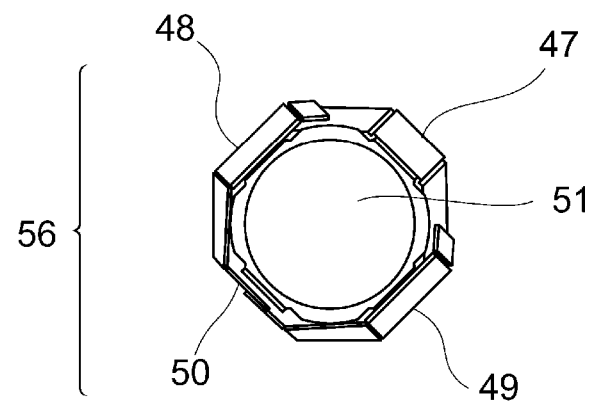
FIG. 10C is a bottom view showing the detection unit and the substrate unit of the sensor shown in FIG. 9.
Figure 10D:
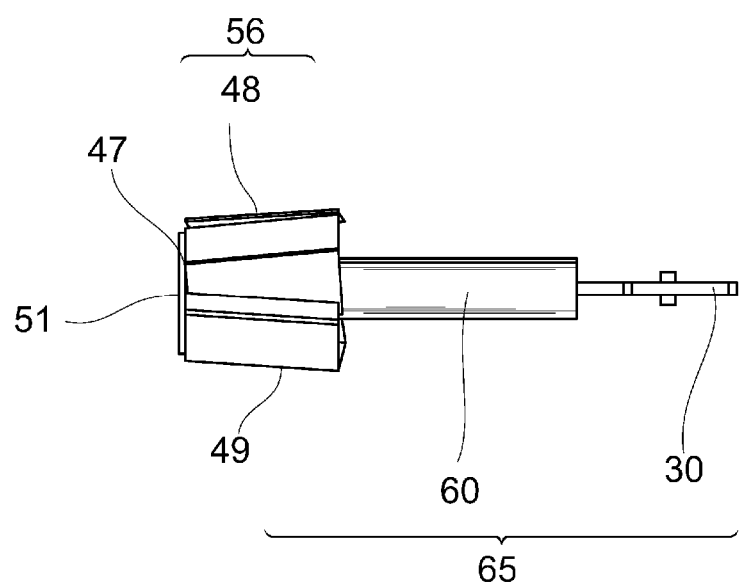
FIG. 10D is a side view showing the detection unit and the substrate unit of the sensor shown in FIG. 9.

As shown in FIG. 10C, since the plurality of side pieces is folded to overlap each other and adhesively fixed to each other due to the adhesive parts 57, it is bent more closely to the side surface of the detection part 40. With such a configuration, when the detection part 40 and the detection part shield 55 are inserted into the housing 10, the side face part 46 can be made difficult to get caught due to the unevenness inside the housing.

In the present example, an example in which the first side piece 47 and the fourth side piece 50 to be disposed inward from the adjacent side pieces have the folds has been described, but the side face part 46 may not have the side pieces having the folds. Specifically, instead of providing the first side piece 47 and the like, two opposing side pieces having no folds are provided, and they are formed to extend in the direction orthogonal to the axial direction to provide a region in which they are folded to overlap each other. The adhesive parts 57 are provided in the overlapping region, and the two side pieces are adhesively fixed by the adhesive parts 57. According to such a configuration, the plurality of side pieces can constitute the side face part 46 with the smaller number of components.

Modified Examples

Although the present invention has been described on the basis of the above-described embodiment, the present invention is not limited to the above-described embodiment. The following cases are also included in the present invention.

The shield 45 according to the above embodiment is divided into and configured of two shield members, the detection part shield 55 and the substrate shield 60, but may be configured of one shield member. Specifically, the side face part of the detection part shield 55 may be configured to extend to one end side (rear side) in the axial direction of the housing 10 to also cover the periphery of the substrate 30 so that the detection part shield 55 also includes the substrate shield 60. With such a configuration, the sensor 1 can reduce the number of components of the shield members and can improve the noise immunity.

The embodiments described above are for facilitating the understanding of the present invention and are not for limitedly constructing the present invention. Each element included in the embodiment and its arrangement, material, condition, shape, size, and the like are not limited to those exemplified and can be changed as appropriate. In addition, the configurations shown in different embodiments can be partially replaced or combined.

A part or the entire of the present embodiment may also be described as in the appendix below, but not limited thereto.

APPENDIX

A proximity sensor including:
a cylindrical housing (10) including an opening part at one end in an axial direction thereof;
a detection part (40) which is housed on the other end side of the housing (10) and detects the presence or absence of a detection target in a non-contact manner;
a substrate (30) which is housed in the housing (10) and on which a control circuit for controlling the detection part is mounted;
a detection part shield (55) configured to prevent noise from entering the detection part (40) from the outside, which includes a first face part (51) that adheres to a front surface located on the other end side of the detection part (40), and a side face part (46) that is configured of a plurality of side pieces connected to an outer periphery of the first face part (51) and bent from the first face part (51) to cover a side surface of the detection part (40); and a resin provided around the detection part (40) and the detection part shield (55).

DESCRIPTION OF REFERENCE NUMERALS

1 Sensor
10 Housing
11 Opening part (of housing)
20 Clamp
24 Recessed part
25 O-ring
30 Substrate
31 Land
32 Indicator lamp
34 Cable strand
35 Cable
36 Ring component
38 Sealing ring
40 Detection part
41 Core
42 Coil
45 Shield
46 Side face part
47 First side piece
48 Second side piece
49 Third side piece
50 Fourth side piece
51 First face part
52 Second face part
55 Detection part shield
56 Detection unit
57 Adhesive part
60 Substrate shield
65 Substrate unit

What is claimed is:

1. A proximity sensor comprising:
a cylindrical housing including an opening part at one end in an axial direction thereof;
a detection part which is housed at the other end side of the housing and detects the presence or absence of a detection target in a non-contact manner;
a substrate which is housed in the housing and on which a control circuit for controlling the detection part is mounted;
a detection part shield which prevents noise from entering the detection part from the outside and which includes a first face part that adheres to a front surface located on the other end side of the detection part, and a side face part that is configured of a plurality of side pieces connected to an outer periphery of the first face part and is bent from the first face part to cover a side surface of the detection part; and
a resin which is provided around the detection part and the detection part shield,
wherein at least a portion of an outer edge of the plurality of side pieces connected to the first face part is tilted away from the first face part.

2. The proximity sensor according to claim 1, wherein the detection part shield includes a second face part which adheres to a back surface of the detection part facing the front surface, is disposed to be located between the detection part and the substrate, and performs relaying for electrical connection between the detection part and the substrate.

3. The proximity sensor according to claim 1, wherein the plurality of side pieces is provided as two pieces and connected to the outer periphery of the first face part to face each other.

4. The proximity sensor according to claim 1, wherein the plurality of side pieces is provided as three or more pieces and connected to the outer periphery of the first face part at substantially equal intervals.

5. The proximity sensor according to claim 1, wherein the plurality of side pieces is provided as four pieces and connected to the outer periphery of the first face part at substantially equal intervals, and one set of side pieces facing each other are folded along folds extending in the axial direction and located further inward than the other set of side pieces facing each other.

6. The proximity sensor according to claim 1, wherein at least some of outer edges of the plurality of side pieces on a first face part side are inclined such that a distance thereof from the first face part increases.

7. The proximity sensor according to claim 1, wherein the plurality of side pieces has a region in which two adjacent side pieces are folded to overlap each other when they are bent from the first face part, and the two adjacent side pieces adhere to each other in the overlapping region.

8. An assembly method of a proximity sensor, wherein the proximity sensor comprises:
a cylindrical housing including an opening part at one end in an axial direction thereof;
a detection part which is housed at the other end side of the housing and detects the presence or absence of a detection target in a non-contact manner;
a substrate which is housed in the housing and on which a control circuit for controlling the detection part is mounted; and
a detection part shield which is configured to prevent noise from entering the detection part from the outside and which includes a first face part, a side face part that is configured of a plurality of side pieces connected to an outer periphery of the first face part, and a second face part connected to the side face part,
wherein at least a portion of an outer edge of the plurality of side pieces connected to the first face part is tilted away from the first face part,
wherein the assembly method of the proximity sensor comprises the steps of:
adhering the first face part of the detection part shield to a front surface located on the other end side of the detection part and adhering the second face part of the detection part shield to a back surface facing the front surface of the detection part;
electrically connecting the detection part to the substrate via the second face part;
adding a resin into the housing through the opening part of the housing; and
inserting the detection part into the housing through the opening part of the housing and moving the detection part to the other end side of the housing while bending the side face part of the detection part shield from the first face part to cover the side surface of the detection part due to the insertion.

\* \* \* \* \*

UNITED STATES PATENT AND TRADEMARK OFFICE
CERTIFICATE OF CORRECTION

PATENT NO. : 11,467,310 B2  
APPLICATION NO. : 17/287115  
DATED : October 11, 2022  
INVENTOR(S) : Yusuke Nakayama et al.

Page 1 of 1

It is certified that error appears in the above-identified patent and that said Letters Patent is hereby corrected as shown below:

On the Title Page

Item (30), change "Foreign Application Priority Data: Oct. 30, 2019" to --Foreign Application Priority Data: Nov. 12, 2018--.

Signed and Sealed this  
Twenty-seventh Day of December, 2022

Katherine Kelly Vidal  
*Director of the United States Patent and Trademark Office*